US012649854B2

(12) United States Patent
Kim et al.

(10) Patent No.: US 12,649,854 B2
(45) Date of Patent: Jun. 9, 2026

(54) METHOD OF PREPARING LAMINATE AND LAMINATE FOR OPTICAL USE

(71) Applicant: LuminaMask Co., Ltd., Cheonan-si (KR)

(72) Inventors: Taewan Kim, Seoul (KR); GeonGon Lee, Seoul (KR); Suk Young Choi, Seoul (KR); Hyung-joo Lee, Seoul (KR); Suhyeon Kim, Seoul (KR); Sung Hoon Son, Seoul (KR); Seong Yoon Kim, Seoul (KR); Min Gyo Jeong, Seoul (KR); HaHyeon Cho, Seoul (KR); Inkyun Shin, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 649 days.

(21) Appl. No.: 18/080,176

(22) Filed: Dec. 13, 2022

(65) Prior Publication Data

US 2023/0193043 A1     Jun. 22, 2023

(30) Foreign Application Priority Data

Dec. 20, 2021     (KR) ......................... 10-2021-0182720

(51) Int. Cl.
| | |
|---|---|
| *C09D 1/00* | (2006.01) |
| *C23C 14/00* | (2006.01) |
| *C23C 14/02* | (2006.01) |
| *C23C 14/18* | (2006.01) |
| *G03F 1/54* | (2012.01) |

(52) U.S. Cl.
CPC ............ *C09D 1/00* (2013.01); *C23C 14/0036* (2013.01); *C23C 14/022* (2013.01); *C23C 14/18* (2013.01); *G03F 1/54* (2013.01)

(58) Field of Classification Search
CPC ..... G03F 1/32; G03F 1/26; G03F 1/80; G03F 1/54; G03F 1/82
See application file for complete search history.

(56) References Cited

U.S. PATENT DOCUMENTS

| | | | |
|---|---|---|---|
| 2005/0006266 A1* | 1/2005 | Kurikawa ................. | G03F 1/66 430/4 |
| 2005/0250018 A1* | 11/2005 | Ushida ...................... | G03F 1/58 428/428 |
| 2013/0273738 A1 | 10/2013 | Sakai et al. | |
| 2015/0111134 A1* | 4/2015 | Suzuki ...................... | G03F 1/80 430/5 |
| 2017/0031241 A1 | 2/2017 | Shen et al. | |
| 2018/0335693 A1* | 11/2018 | Hiromatsu ................ | G03F 1/40 |
| 2020/0150523 A1 | 5/2020 | Chou et al. | |

FOREIGN PATENT DOCUMENTS

| | | |
|---|---|---|
| CN | 1958177 A | 5/2007 |
| CN | 106391542 A | 2/2017 |
| CN | 108292100 A | 7/2018 |
| JP | 2001-293443 A | 10/2001 |
| JP | 2002-336804 A | 11/2002 |
| JP | 2004-53817 A | 2/2004 |
| JP | 2007-118002 A | 5/2007 |
| JP | 2010-117403 A | 5/2010 |
| JP | 2011-221063 A | 11/2011 |
| JP | 2015-022150 A | 2/2015 |
| JP | 2018-534608 A | 11/2018 |
| JP | 2019-179813 A | 10/2019 |
| KR | 10-0316374 B | 11/2001 |
| KR | 10-0745065 B | 7/2007 |
| KR | 10-2009-0016210 A | 2/2009 |
| KR | 10-2011-0016737 A | 2/2011 |
| KR | 10-2012-0101427 A | 9/2012 |
| KR | 10-2017-0015067 A | 2/2017 |
| KR | 10-2018-0057697 A | 5/2018 |
| KR | 10-1913431 B | 10/2018 |
| TW | 201815694 A | 5/2018 |
| WO | WO 2012/086744 A1 | 6/2012 |

* cited by examiner

*Primary Examiner* — Stewart A Fraser
(74) *Attorney, Agent, or Firm* — NSIP Law

(57) ABSTRACT

The method of preparing a laminate includes: preparing a process target, which is a laminate before being processed, where a light-shielding film has been disposed; and preparing a cleaned laminate through a first cleaning including applying UV rays and carbonated water to the process target, wherein the light-shielding film includes a transition metal and an element selected from the group consisting of oxygen, nitrogen, and carbon.

7 Claims, No Drawings

METHOD OF PREPARING LAMINATE AND LAMINATE FOR OPTICAL USE

CROSS-REFERENCE TO RELATED APPLICATIONS

Pursuant to 35 USC 120 and 365(c), this application claims the benefit under 35 USC 119(a) of Korean Application No. 10-2021-0182720 filed on Dec. 20, 2021, in the Korean Intellectual Property Office, the entire disclosure of which is incorporated herein by reference for all purposes.

BACKGROUND

1. Field

The present disclosure relates to a method of preparing a laminate for optical use and the laminate for optical use.

2. Description of the Background

An optical laminate is used in a manufacturing process of a semiconductor. For example, in the case of a photomask for a semiconductor, the optical laminate is enlarged to be about three to four times larger and utilized for exposure in a manufacturing process of a semiconductor. As wiring of semiconductors is more refined and complicated, the performance required in the optical laminate, such as accuracy of a higher level for the pattern of lines or almost complete removal of grainy impurities, is becoming more complicated.

A blank mask may include thin films such as a light transmitting substrate and a light-shielding film. The light transmitting substrate may be manufactured from a material having a light transmitting characteristic through a polishing process, a cleaning process, and the like, after shaping machining of the material.

As a circuit pattern developed on a wafer is miniaturized, it is required to suppress defects, which may be caused in a manufacturing process of a blank mask. Particular ions remaining on the surface of a blank mask (e.g., a thin film containing a metal) may be grown into grainy impurities depending on conditions such as an energy of an exposure light, exposure to other chemical materials, and the like. Additionally, the ions may increase haze when particular conditions are satisfied, and thereby an undesired distorted pattern may be transferred during exposure.

SUMMARY

In one general aspect, the method of preparing the laminate of the present disclosure includes: preparing a process target, which is a laminate before being processed, where a light-shielding film has been disposed; and preparing a cleaned laminate through a first cleaning including applying UV rays and carbonated water to the process target, wherein the light-shielding film may include a transition metal and an element selected from the group consisting of oxygen, nitrogen, and carbon.

The laminate may include residual ions measured by ion chromatography, wherein the residual ions may include sulfur-based ions and nitric acid-based ions.

An amount of the sulfur-based ions may be more than 0 ng/cm$^2$ and less than or equal to 0.1 ng/cm$^2$ and an amount of the nitric acid-based ions may be more than 0 ng/cm$^2$ and less than or equal to 0.1 ng/cm$^2$.

The light-shielding film may be manufactured by a sputtering method.

The sputtering method may include: disposing a target including the transition metal; and performing the sputtering while allowing a reactive gas including a gas containing oxygen atoms, a gas containing nitrogen atoms, or a gas containing carbon atoms to be injected.

The UV rays may have a wavelength ranging 190 nm to 290 nm with an intensity of 1 mW/cm$^2$ to 11 mW/cm$^2$.

The carbonated water may have an electric conductivity of 1 μS/cm to 10 μS/m.

The UV rays may be irradiated before applying the carbonated water, wherein a wavelength of the UV rays may be equal to or more than 120 nm and less than 190 nm.

The carbonated water may be applied with megasonic.

The method may further include a second cleaning, wherein the second cleaning includes applying carbonated water and hydrogen water together as a cleaning solution to the process target to which the first cleaning has been performed.

The laminate may have a variation of 0% to 0.1% in an optical density between the laminate before being processed and the cleaned laminate, and may have a variation of 0 Å to 5 Å in a thickness between the laminate before being processed and the cleaned laminate.

In another general aspect, the laminate of the present disclosure is a laminate where a light-shielding film has been disposed, the light-shielding film includes a transition metal and an element selected from the group consisting of oxygen, nitrogen, and carbon, wherein a reflexivity of the light-shielding film is 35% or less with respect to a light having a wavelength of 193 nm.

The laminate may include residual ions measured by ion chromatography, wherein the residual ions may include sulfur-based ions and nitric acid-based ions.

An amount of the sulfur-based ions may be more than 0 ng/cm$^2$ and less than or equal to 0.1 ng/cm$^2$ and an amount of the nitric acid-based ions may be more than 0 ng/cm$^2$ and less than or equal to 0.1 ng/cm$^2$.

The residual ions may include halogen ions, wherein an amount of the halogen ions may be more than 0 ng/cm$^2$ and less than or equal to 0.1 ng/cm$^2$.

The transition metal may include chrome, and the halogen ions may include fluorine ions or chlorine ions.

The residual ions may include ammonia ions, and an amount of the ammonia ions may be more than 0 ng/cm$^2$ and less than or equal to 1.0 ng/cm$^2$.

The residual ions may include ionic impurities including sulfur-based ions, nitric acid-based ions, halogen ions, and ammonia ions, and an amount of the ionic impurities may be more than 0 ng/cm$^2$ and less than or equal to 1.5 ng/cm$^2$.

The residual ions may include sodium ions, phosphoric acid ions, potassium ions, magnesium ions and calcium ions, and a sum of an amount of the sodium ions, an amount of the phosphoric acid ions, an amount of the potassium ions, an amount of the magnesium ions, and an amount of the calcium ions may be equal to or more than 0 ng/cm$^2$ and less than or equal to 0.01 ng/cm$^2$.

The laminate may be a photomask blank or a photomask.

DETAILED DESCRIPTION OF EXEMPLARY EMBODIMENTS

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this disclosure, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, "B being placed on A" means that B is placed in direct contact with A or placed over A with another layer or structure interposed therebetween and thus should not be interpreted as being limited to B being placed in direct contact with A.

In this disclosure, a singular form is contextually interpreted as including a plural form as well as a singular form unless specially stated otherwise.

In this disclosure, the ppm indicated unless specially stated is based on the weight.

In this disclosure, the room temperature is any one temperature of about 20° C. to about 25° C.

In this disclosure, the humidity refers to a relative humidity.

In this disclosure, the intensity of radiation refers to the intensity of a light source.

An objective of the present disclosure is to provide a manufacturing method of a laminate for removing particles and the like present on the outer surface of the laminate. Also, the method enables effective control of the occurrence of undesired haze during an exposure process, and to provide the laminate, and the like.

Another objective of the present disclosure is to provide a blank mask, whose defects have been reduced and a manufacturing method of the same.

The manufacturing method of a laminate, the laminate and the like of the present disclosure can remove particles present on the outer surface or the surface of the laminate and can effectively suppress the occurrence of undesired haze in an exposure process, while minimizing variation in the properties of the laminate.

Hereinafter, the present disclosure will be described in further detail.

Manufacturing Method of Laminate

In one general aspect, a manufacturing method of the laminate according to one embodiment of the present disclosure includes preparing a process target and cleaning the laminate with carbonated water.

The manufacturing method of the laminate may include manufacturing a light-shielding film, preparing a process target, and a cleaning the laminate with carbonated water.

The manufacturing method of the laminate may include preparing a process target, a UV cleaning, and cleaning the target with carbonated water.

The manufacturing method of the laminate may include preparing a light-shielding film, preparing a process target, a UV cleaning, and cleaning the target with carbonated water.

The manufacturing method of the laminate may include preparing a process target, a cleaning the target with carbonated water, and rinsing the target.

The manufacturing method of the laminate may include preparing a light-shielding film, preparing a process target, cleaning the target with carbonated water, and rinsing the target.

The manufacturing method of the laminate may include preparing a process target, cleaning the target with UV, cleaning the target with carbonated water, and rinsing the target.

The manufacturing method of the laminate may include preparing a light-shielding film, preparing a process target, a UV cleaning of the target, cleaning the target with carbonated water, and rinsing the target.

The process target is a laminate before being processed, where a light-shielding film described below has been disposed.

The preparation of the process target may include disposing and fixing the process target in a chamber, or disposing apparatus, where multiple process targets have been arranged side by side, in the chamber.

The UV cleaning operation is an operation of treating the process target to be irradiated by UV rays with a wavelength of equal to or more than 120 nm and less than 190 nm. The wavelength of the UV rays may be equal to or more than 138 nm and less than 185 nm, or equal to or more than 154 nm and less than 178 nm.

The radiation of UV rays may be performed by a light source, and one or plural light sources may be disposed. In this case, the surface of a substrate as a cleaning target can be irradiated by a light with an even intensity overall.

The UV cleaning operation may be performed by radiation in an intensity of 20 mW/cm$^2$ to 55 mW/cm$^2$. The UV cleaning operation may be performed by radiation in an intensity of 30 mW/cm$^2$ to 50 mW/cm$^2$. The UV cleaning operation may be performed by radiation in an intensity of 35 mW/cm$^2$ to 45 mW/cm$^2$.

Through the UV cleaning operation, before proceeding of subsequent processes, a compound strongly absorbing a light with a wavelength in the range of about 100 nm to about 190 nm can be efficiently removed. In detail, the UV cleaning operation may transmit light energy to particles including organic matters and the like, thereby inducing cutting of chemical bond inside the organic matters, and can accelerate decomposition and removal of particles including the organic matters. Through the above, the UV cleaning operation can increase credibility of the manufacturing method further as a whole.

The cleaning operation with carbonated water is an operation of preparing a laminate cleaned by a cleaning process with carbonated water, which includes adding UV rays and carbonated water to a process target.

The cleaning operation with carbonated water may be optionally performed by a first cleaning, a second cleaning, and a third cleaning described below.

The first cleaning is a process, in which UV rays and carbonated water are applied together.

In the cleaning operation with carbonated water, the UV rays may have wavelength in the range of 190 nm to 290 nm. The UV rays may have wavelength in the range of 230 nm to 280 nm. In the cleaning operation with carbonated water, the UV rays may have an intensity of 1 mW/cm$^2$ to 11

$mW/cm^2$. In the cleaning operation with carbonated water, the UV rays may have an intensity of 3 $mW/cm^2$ to 10 $mW/cm^2$. In the cleaning operation with carbonated water, the UV rays may have an intensity of 4 $mW/cm^2$ to 9 $mW/cm^2$. In such a case, the UV rays applied with carbonated water enable efficient cleaning in addition to minimizing damage to a substrate.

In the cleaning operation with carbonated water, the carbonated water may have an electric conductivity of 1 µS/cm to 10 µS/cm. The carbonated water may have an electric conductivity of 2 µS/cm to 8 µS/cm. The carbonated water may have an electric conductivity of 3 µS/cm to 7 µS/cm. When the carbonated water having the above electric conductivity is applied, excellent cleaning effect can be obtained while damage to the surface of a laminate is minimized.

In the cleaning operation with carbonated water, the carbonated water may be supplied at a rate of 1,500 to 4,000 ml/min per an area of 504 $cm^2$. Also, the carbonated water may be supplied at a rate of 2,000 to 3,000 ml/min per an area of 504 $cm^2$. The carbonated water may be supplied by one nozzle, or two or more nozzles.

When UV rays and carbonated water are applied together, while an excellent result of cleaning is obtained, damage to the surface of the laminate can be decreased and the efficiency of a process can be addressed at the same time.

Megasonic may be applied with the carbonated water as a cleaning solution. Megasonic may be applied through an apparatus for generating megasonic equipped in a nozzle, when a cleaning solution is injected through the nozzle, but the megasonic is not limited thereto.

When the front (the surface where a light-shielding film has been exposed) of the laminate is washed, the megasonic may be applied in a frequency of 0.5 MHz to 1.3 MHz and an intensity of 5 W to 12 W. Also, when the rear (the surface where quartz has been exposed) of the laminate is washed, the megasonic may be applied in a frequency of 1 MHz to 1.8 MHz and an intensity of 20 W to 45 W. When megasonic is applied together, it is possible to perform further efficient cleaning.

The second cleaning is a process, in which carbonated water and hydrogen water are applied together. After the first cleaning, the second cleaning may proceed. The second cleaning refers to a process of cleaning by application of both carbonated water ($DICO_2$) and hydrogen water ($DIH_2$) as cleaning solutions, and at this time, the carbonated water and the hydrogen water may be applied in a volume ratio of 1:0.1 to 10 or 1:0.5 to 2. The detailed description of the carbonated water to be applied is the same as above and thus further description is omitted.

The hydrogen water may have hydrogen in an amount of 0.7 ppm to 3 ppm, or 0.9 ppm to 2 ppm.

In the second cleaning, the megasonic may also be applied, and the detailed description is the same as above.

The third cleaning is a process of cleaning a surface by hydrogen water. At this time, density of the hydrogen water, whether megasonic is applied, and the detailed conditions are the same as above. The third cleaning is preferred to be applied with the first cleaning or the second cleaning.

A rinsing operation is an operation of rinsing the laminate with carbonated water and/or hydrogen water.

In the rinsing operation, the carbonated water may be supplied to the rear surface (the surface where quartz has been exposed or the surface disposed far from a light-shielding film) of the laminate at a rate of 500 to 2,000 ml/min per an area of 504 $cm^2$ in the laminate.

In the rinsing operation, the carbonated water may have an electric conductivity of 1 µS/cm to 10 µS/m. The carbonated water may have an electric conductivity of 2 µS/cm to 8 µS/m. The carbonated water may have an electric conductivity of 3 µS/cm to 7 µS/m. The carbonated water may be one, whose density measured by electric conductivity is the same as the density in the cleaning operation with carbonated water or may have a density different from the density in the cleaning operation with carbonated water.

In the rinsing operation, ozone water may be applied. The ozone water is applied only for treatment of the rear surface of the laminate, and substantially not applied for treatment of the front surface (the surface where a light-shielding film has been exposed).

Through the above, it is possible to control variation in the optical properties of the laminate caused from being cleaned, further efficiently.

The ozone water may have a density of ozone of 40 to 120 ppm (based on the weight). The ozone water may have a density of ozone of 50 to 110 ppm (based on the weight), or 80 to 105 ppm (based on the weight). The ozone water may be manufactured using an ozone generator available from MKS Instruments, Inc.

The ozone water may be supplied to the rear surface (the surface where quartz has been exposed or the surface disposed far from a light-shielding film) of the laminate at a rate of 300 to 1,000 ml/min per an area of 504 $cm^2$.

The manufacturing method of the laminate does not apply ozone water separately as a process between the preparation of the process target and the rinsing operation. Through the above, it is possible to minimize chemical variation or loss of the surface layer of the light-shielding film.

The carbonated water and the hydrogen water mentioned above may not have ozone in a substantial amount. The carbonated water and/or hydrogen water including ozone in a very small amount, which cannot function as ozone water, may also mean that the carbonated water and/or hydrogen water substantially do not include ozone, and for example, the density of ozone may be 10 ppm or less.

When the carbonated water is applied, or the carbonated water and the hydrogen water are applied, damage to a light-shielding film caused from ozone can be substantially suppressed. Additionally, variation in the properties of the light-shielding film, which can be caused in a process such as cleaning, can be minimized.

The light-shielding film exhibits different durability depending on the shape of an oxide film of a transition metal M and oxygen O. Specifically, when having the shape of $M_2O_3$, the oxide film may be considered as being more stable. However, the $M_2O_3$ oxide film may be changed into the shape of $MO_3$ in some parts where contacting with ozone. This may be due to the fact that the $MO_3$ oxide film is relatively easily damaged or eliminated when being cleaned while the $M_2O_3$ oxide film is not easily damaged or eliminated when being cleaned.

When the cleaning operation with carbonated water or the like of the present disclosure is applied, it is possible to provide a laminate minimized in the amount of traced impurities or residual ions detected during manufacture thereof while damage or variation in the properties of the light-shielding film is minimized.

The detailed description of the shape of oxide on the surface of a film, the degree of residual ions included in a laminate after being cleaned is made below in detail, and thus omitted.

A laminate including a light-shielding film disposed on a supporting unit may be manufactured through a manufacturing operation of a light-shielding film applied with a sputtering method.

The detailed description of the supporting unit is overlapped with the description of a laminate described below and thus further description is omitted.

The light-shielding film may be manufactured by a sputtering method.

The sputtering method is a method of disposing a target including a transition metal and performing sputtering in the atmosphere containing a reactive gas including a gas containing oxygen atoms, a gas containing nitrogen atoms, or a gas containing carbon atoms.

The atmosphere may include a reactive gas and an inert gas together.

The target may be applied by a target containing a transition metal.

The target may be applied by two or more targets including one target containing a transition metal.

The target containing a transition metal may include a transition metal in an amount of 90 at % or more. The target containing a transition metal may include a transition metal in an amount of 95 at % or more. The target containing a transition metal may include a transition metal in an amount of 99 at % or more.

The target including a transition metal may be applied by a target composed of a transition metal included in a light-shielding film. At this time, preparing a target consisting of a transition metal may refer to a target consisting of one kind of a transition metal or preparing a target to have two or more kinds of transition metals simultaneously. At this time, the phrase "consisting of a transition metal" includes a case of having unavoidable impurities, and is not analyzed as limiting to the case consisting of only a transition metal in a strict meaning.

The transition metal may include at least one selected from the group consisting of Cr, Ta, Ti and Hf. The transition metal may include Cr.

The reactive gas reacts with the transition metal to form a sputtering film. For example, the reactive gas reacts with any one selected from the group consisting of oxides of a transition metal, nitrides of a transition metal, carbides of a transition metal, and combinations thereof. The light-shielding film may be an amorphous structure overall, or may be an amorphous structure partially including crystallite.

The gas containing oxygen atoms may be, for example, oxygen, carbon oxides (CO, $CO_2$, etc.), or nitrogen oxides (NO, $NO_2$, $N_2O$, $N_2O_3$, etc.). The gas containing nitrogen atoms has examples of nitrogen, and nitrogen oxides (NO, NO2, N2O, N2O3, etc.). The gas containing carbon atoms may be, for example, carbon oxides (CO, $CO_2$, etc.) or methane. To introduce oxygen atoms to a light-shielding film, it is preferred to apply a compound containing oxygen instead of oxygen itself in that reaction thereof is easily controlled.

As an inert gas, for example, a helium gas, an argon gas, or the like may be applied, but the type of the gas is not limited thereto.

The sputtering may include: i) disposing a target and a supporting unit in a chamber and injecting an atmosphere gas into the chamber, ii) applying an electric power to sputtering apparatus, and iii) forming a film on the supporting unit by separating transition metal particles from the target with oxygen, nitrogen, or carbon included in a reactive gas.

The separation of the transition metal particles may be performed by a sputtering gas. The sputtering gas refers to a gas ionizing in a plasma atmosphere to collide with a target.

The sputtering gas may be Ar gas.

DC power source may be used as a power source applied to sputtering, or RF power source may be used for sputtering.

An electric power of 1.5 kW to 2.5 kW may be applied to sputtering.

The light-shielding film may pass through thermal treatment. The process of thermal treatment may bring an effect of improving properties such as removing unnecessary stress caused from a process for forming a light-shielding film and improving thickness uniformity and smoothness of the light-shielding film.

When the thermal treatment proceeds in an atmosphere containing oxygen, it is possible to form a surface layer of the light-shielding film having oxygen in an increased amount on the surface of the light-shielding film.

When the thermal treatment proceeds in an atmosphere containing nitrogen, it is possible to form a surface layer of the light-shielding film having nitrogen in an increased amount on the surface of the light-shielding film.

The thermal treatment may proceed in a temperature of about 150° C. to about 330° C.

The thermal treatment may proceed in a time of about 5 minutes to about 30 minutes.

A light-shielding film manufactured in this manner has characteristics described in detail in the "Laminate" paragraphs below.

A manufacturing method of the laminate may include preparation of a process target, a UV cleaning, a cleaning with carbonated water, and a rinsing as cleaning processes of the laminate.

Laminate

A laminate as a process target includes a light-shielding film.

A light-shielding film has been disposed in the laminate as a process target.

In detail, the laminate may include a light-shielding film disposed on a supporting unit.

The light-shielding film may cover one surface of the supporting unit entirely, or may cover only some parts of the surface of the supporting unit.

The supporting unit may include a light transmitting substrate.

The supporting unit may include a light transmitting substrate and a light-shielding film directly placed thereon.

The supporting unit may include a light transmitting substrate, a phase shift film disposed on the substrate, and a light-shielding film disposed on the phase shift film.

The supporting unit may include a light-shielding film disposed partially. In detail, the light-shielding film may be directly contacted to the light transmitting substrate to be disposed on the light transmitting substrate. In another case, the light-shielding film may be disposed on the top of the phase shift film disposed on the light transmitting substrate. In another case, the supporting unit may have the above dispositions present together on one substrate.

The process target may be a laminate including a light-shielding film. The laminate may have optical use. The process target may be a photomask blank or a photomask.

The light transmitting substrate may be a quartz substrate and the like. At this time, the light transmitting substrate refers to a substrate having a transmittance of about 85% to about 100% with respect to an exposure light, and at this time, the exposure light may be ArF light, but the type of the exposure light is not limited thereto.

Any phase shift film applied in the field of a photomask may be applicable as the phase shift film. For example, the phase shift film may include molybdenum and/or silicon, and may include oxides thereof or nitrides thereof.

A laminate may include a portion not having the phase shift film (light transmitting portion) and a portion having the phase shift film (phase shift portion) at the same time on the supporting unit. The light transmitting portion and the phase shift portion may have a phase shift retardation of about 160 degrees to about 230 degrees, or about 168 degrees to about 185 degrees.

The light-shielding film may be a film including a transition metal and oxygen, nitrogen, or carbon.

The transition metal may include at least one selected from the group consisting of Cr, Ta, Ti and Hf. The transition metal may include Cr.

In detail, the light-shielding film may include an element selected from the group consisting of Cr, oxygen, nitrogen, carbon, and combinations thereof.

In detail, the light-shielding film may include a compound selected from the group consisting of CrO, CrON, CrOCN, and combinations thereof.

The light-shielding film may be one substantially having a two layered structure. For example, in order to control the surface strength of the light-shielding film and the like, a surface layer of the light-shielding film may have oxygen or nitrogen in a greater amount to the surface direction than the base of the light-shielding film. The light-shielding film except for the surface layer of the light-shielding film is referred to as a lower layer of the light-shielding film to be distinguished from the surface layer of the light-shielding film.

The surface layer of the light-shielding film may have a thickness of 30 to 80 nm, or 40 to 70 nm. The lower layer of the light-shielding film and the surface layer of the light-shielding film may have a thickness ratio of 1:0.02 to 0.25, or a thickness ratio of 1:0.04 to 0.18. However, between the surface layer of the light-shielding film and the lower layer of the light-shielding film, a boundary may not be obviously observed. In such a case, the area having oxygen in an amount of 25 atom % or less may be considered as the surface layer of the light-shielding film.

When a cleaning operation with carbonated water described above is applied, it is substantially possible to suppress damage of the surface layer of the light-shielding film in addition to minimizing a variation between properties before and after a cleaning process.

The laminate may have a variation of about 0 Å to about 5 Å in the thickness between the laminate before being processed and the cleaned laminate with carbonated operation. The thickness variation may have a value of about 0 Å to about 2 Å, or about 0.1 Å to about 1.5 Å. In general, the thickness variation exhibits a tendency of becoming thinner in the thickness. This may be caused from separation of some metal oxides due to the oxidation described above. However, the thickness variation may include the case of thickness increase, and not be analyzed in limitation to thickness decrease.

The laminate may have a variation of about 0% to 0.05% in the transmittance between the laminate before being processed and the cleaned laminate with carbonated water. The variation in the transmittance may have a value of about 0% to 0.03%, or about 0% to 0.008%.

The laminate may have a variation of about 0% to about 0.1% in the optical density between the laminate being processed and the cleaned laminate carbonated water. The variation in the optical density may have a value of about 0% to about 0.05, or about 0% to about 0.01%. The variation in the optical density has a tendency of decreasing optical density, and this is thought to be related to the above variation in the thickness. However, the variation in the optical density is not limited to decrease to be analyzed.

The laminate may have a variation of about 0% to about 0.5% in the reflectance between the laminate before being processed and the cleaned laminate carbonated water (after treatment). The variation in the reflectance may have a value of about 0% to about 0.25%.

The laminate after passing through the treatment (after being washed) may be one substantially not having extremely fine particles in a size of 50 nm or less detected therefrom. At this time, the phrase that substantially not having extremely fine particles detected therefrom refers to having two, one, or less extremely fine particles or not having the extremely fine particles detected therefrom, when one laminate is inspected.

After the treatment, the laminate may be controlled as the same as described below in the amount of residual ions. At this time, when the amount of residual ions is insignificant, it refers to that the amount of residual ions measured by a predetermined method is less than the amount described below.

The laminate of the present disclosure has a characteristic in the amount of residual ions, which is insignificant when measured by ion chromatography.

Extremely fine particles absorbed on the laminate and not completely removed even in a cleaning process or ions remaining in the laminate itself may adversely influence the quality of the laminate. In the process of utilizing the laminate, elements, which become unstable caused from the laminate repetitively irradiated by energy, may move to the surface of the laminate, and the residual ions in the internal of the laminate may meet other ions to induce undesired reaction. At this time, grainy impurities may be formed, or haze may occur in some parts of the laminate.

When the amount of residual ions detected from a inspecting process after cleaning is insignificant, it is possible to decrease formation of grainy impurities and/or occurrence of haze. Additionally, such a suppression in the formation of grainy impurities and such a suppression in the occurrence of haze are evaluated as a further important characteristic recently as designs for semiconductors evolve to have finer lines.

The measurement of residual ions utilizing ion chromatography is made by a method described in embodiments. As for simple description of the process of measuring residual ions, one laminate kept in a box for product storage is placed in a clean bag, deionized water of 100 ml is injected thereto, and the clean bag is relocated to a water tank prepared at 90° C. Thereafter, the clean bag is left for 120 minutes for ions to be separated from the surface of the laminate. The deionized water retrieved from the clean bag is detected by ion chromatography for quantifying density thereof. The size of the laminate is based on applying a size having a width of about 5 inches to about 7 inches, a length of about 5 inches to about 7 inches, and a height of about 0.1 inches to about 0.5 inches, and when the size (surface area) of the laminate is changed, the amount of the deionized water may be differently applied in proportion thereto.

The residual ions may include sulfur-based ions.

The sulfur-based ions include SOx such as sulfur acid ions $(SO_4{}^{2-})$.

The residual ions may include nitric acid-based ions.

The nitric acid-based ions may include NOx such as nitrite ions ($NO^{2-}$) or nitric acid ions ($NO^{3-}$).

The amount of the sulfur-based ions may be about 0.1 $ng/cm^2$ or less. or about 0.8 $ng/cm^2$ or less. The amount of the sulfur-based ions may be of more than about 0 $ng/cm^2$, more than about 0.1 $ng/cm^2$, or more than about 0.3 $ng/cm^2$.

The amount of the nitric acid-based ions may be about 0.1 $ng/cm^2$ or less. or about 0.05 $ng/cm^2$ or less. The amount of the nitric acid-based ions may be more than about 0 $ng/cm^2$, or about more than 0.1 $ng/cm^2$.

The amounts of the sulfur-based ions and the nitric acid-based ions same as the above are degrees of residual ions excellent for a laminate to be applied as a photomask, and particularly the occurrence of haze, which may be caused in a process of using the photomask, can be substantially suppressed.

The residual ions may include halogen ions.

The halogen ions may include fluorine ions, chlorine ions, or both of fluorine and chlorine ions.

The amount of the halogen ions may be about 0.1 $ng/cm^2$ or less, about 0.05 $ng/cm^2$ or less, or about 0.03 $ng/cm^2$ or less. The amount of the halogen ions may be more than about 0 $ng/cm^2$, about 0.01 $ng/cm^2$, or more.

When chrome is included as the transition metal, the amount of the halogen ions may be shown to be high. This may be caused from a characteristic of chrome, which draws chlorine ions and the like within air or a solution for treatment because of high affinity of chrome with chlorine ions and the like.

The residual ions may include ammonium ions.

The ammonium ions may have an amount of about 1.0 $ng/cm^2$ or less, about 0.7 $ng/cm^2$ or less, or about 0.5 $ng/cm^2$ or less. The ammonium ions may have an amount of more than about 0 $ng/cm^2$, more than about 0.1 $ng/cm^2$, more than about 0.3 $ng/cm^2$. The ammonium ions have an amount in the above range, it is substantially possible to suppress the occurrence of grainy impurities or the occurrence of haze.

The residual ions may include sulfur-based ions, nitric acid-based ions, halogen ions, and ammonia ions, and specifically, $SO_4{}^{2-}$, $NO^{2-}$, $NO^{3-}$, $Cl^-$ and $NH^{4+}$ may be referred to as ionic impurities.

The ionic impurities may have an amount of about 1.5 $ng/cm^2$ or less, about 1.0 $ng/cm^2$ or less, or about 0.7 $ng/cm^2$ or less. The ionic impurities may have an amount of more than about 0 $ng/cm^2$ or less, more than about 0.1 $ng/cm^2$ or less, or more than about 0.3 $ng/cm^2$.

The laminate having such a characteristic is thought as considerably well controlled in the amount of ionic impurities in the state of having a light-shielding film formed thereon, and when such a laminate is applied as a photomask and the like, control of defects can be easier.

The residual ions may include sodium ions.

The residual ions may include phosphoric acid ions.

The residual ions may include potassium ions.

The residual ions may include magnesium ions.

The residual ions may include calcium ions.

The sum of the amount of the sodium ions, the amount of the phosphoric acid ions, the amount of the potassium ions, the amount of the magnesium ions, and the amount of the calcium ions may have a value of about 0 $ng/cm^2$ to about 0.01 $ng/cm^2$. In such a case, the concentration of the residual ions of the laminate is controlled well, and it is possible to provide a photomask, in which the possibility of the occurrence of grainy defects and the degree of the occurrence of haze are substantially lowered.

The light-shielding film may have a reflectance of about 35% or less, about 30% or less. The reflectance may be about 20% or more, about 23% or more, or about 25% or more.

The exposure light may be a light with the wavelength of about 193 nm.

The exposure light may be ArF light.

The light-shielding film functions as blocking a light with a desired wavelength at least partially. Accordingly, the light-shielding film may exhibit a reflectance of a surface relatively higher than a light transmitting film. However, when the reflectance of the light-shielding film is excessively high, the accuracy of the result of an inspection for checking whether a defect is present or absent in a laminate may be difficult. An inspection process is a process for checking surface defects of a light-shielding film, whether presence or absence of impurities, and this is a process applied to a manufacturing process of a photomask blank. That is, when the surface reflectance of the light-shielding film is excessively high, the credibility of a laminate may be decreased as a result. Accordingly, it is required to adjust the surface reflectance of the light-shielding film. A testing light may be applied to be similar to the exposure light or may be applied to be different from the exposure light, however, in the above, a reflectance based on the exposure light is disclosed.

For obtaining effects of regulating the surface reflectance, improving durability, and the like, the characteristics of the surface layer of the light-shielding film and the lower layer of the light-shielding film may be differently controlled, respectively. To achieve the above objectives, methods of laminating the surface layer of the light-shielding film having a greater distribution of oxygen or nitrogen than the distribution of the lower layer of the light-shielding film, or processing the surface of the light-shielding film, which has been previously formed by oxidation or nitrification, may be necessary.

When the light-shielding film includes a compound in the form of $M_2O_3$ (M is a transition metal and O is oxygen), some of the compound may be changed to the form of $MO_3$ by treatment like oxidation and the like. For example, when chrome is applied as a transition metal, some of $Cr_2O_3$ may be changed into $CrO_3$ due to the oxidation treatment, cleaning, and the like, and as a result, the amount of $CrO_3$ may be substantially increased in the surface layer of the light-shielding film. Because $Cr_2O_3$ has a characteristic, which is relatively strong against an external force of damage, $CrO_3$ causes loss more easily compared to $Cr_2O_3$. Accordingly, a light-shielding film containing $CrO_3$ in a large amount may easily cause a loss of the film itself during a process like cleaning and the like. This may bring a variation in various optical properties such as a variation in the thickness, a variation in the optical density, a variation in the transmittance, and a variation in the reflectance. Also, the light-shielding film containing $CrO_3$ in a large amount is thought as more easily generated when a relatively strong cleaning treatment of oxidation is performed. However, when the cleaning is not sufficient, the residual ions or impurities of the laminate may not be sufficiently removed.

The light-shielding film is manufactured by application of a manufacturing method and the like including a cleaning process described above, and thereby a manufacturing method of a laminate, in which the amount of impurities or residual ions has been decreased while a variation in the optical properties of the light-shielding film such as reflectance is minimized, is disclosed.

The light-shielding film may include a transition metal, and at least any one between oxygen and nitrogen.

The light-shielding film may include a transition metal in an amount of 35 at % or more, about 40 at % or more, about 45 at % or more, or about 50 at % or more. The light-shielding film may include a transition metal in an amount of about 75 at % or less, about 70 at % or less, about 65 at % or less, or about 60 at % or less. At this time, the amount of a transition metal in the light-shielding film refers to a value obtained by averaging the amounts of the transition metals in the entire light-shielding film including the lower layer of the light-shielding film and the surface layer of the light-shielding film.

The light-shielding film may include oxygen in an amount of about 15 at % or more, about 20 at % or more, or about 25 at % or more. The light-shielding film may include oxygen in an amount of about 55 at % or less, about 50 at % or less, or about 45 at % or less. At this time, the amount of oxygen in the light-shielding film refers to a value obtained by averaging the amounts of oxygen in the entire light-shielding film including the lower layer of the light-shielding film and the surface layer of the light-shielding film.

The light-shielding film may include nitrogen in an amount of about 15 at % or more, about 20 at % or more, or about 25 at % or more. The light-shielding film may include nitrogen in an amount of about 55 at % or less, about 50 at % or less, or about 45 at % or less. At this time, the amount of nitrogen of the light-shielding film refers to a value obtained by averaging the amounts of nitrogen in the entire light-shielding film including the lower layer of the light-shielding film and the surface layer of the light-shielding film.

The light-shielding film may include carbon in an amount of about 1 at % or more, about 2 at % or more, or about 3 at % or more. The light-shielding film may include carbon in an amount of about 10 at % or less, or about 8 at % or less. At this time, the amount of carbon of the light-shielding film refers to a value obtained by averaging the amounts of carbon in the entire light-shielding film including the lower layer of the light-shielding film and the surface layer of the light-shielding film.

The surface layer of the light-shielding film may include a transition metal in an amount of about 10 at % or more, about 15 at % or more, or about 20 at % or more. The surface layer of the light-shielding film may include a transition metal in an amount of about 45 at % or less, about 40 at % or less, about 35 at % or less, or about 30 at % or less.

The surface layer of the light-shielding film may include oxygen in an amount of about 35 at % or more, about 40 at % or more, or about 42 at % or more. The surface layer of the light-shielding film may include oxygen in an amount of about 65 at % or less, about 60 at % or less, about 55 at % or less, or about 50 at % or less.

The surface layer of the light-shielding film may include nitrogen in an amount of about 1 at % or more, about 3 at % or more, or about 5 at % or more. The surface layer of the light-shielding film may include carbon in an amount of about 35 at % or less, about 30 at % or less, or about 25 at % or less.

Hereinafter, the present disclosure will be described in further detail with reference to accompanying examples. The following embodiments are only examples for understanding the present disclosure, and the range of the present disclosure is not limited to the same.

Experiment Example: Manufacture Example (Manufacture of Laminate Including Light-Shielding Film)
On a light transmitting substrate made from synthetic quartz in the size having the width of 6 inches, the length of 6 inches, and the thickness of 0.25 inches, the same substrate having a phase shift film having a phase retardation of about 180° with respect to a light with the wavelength of 193 nm was prepared, and applied to manufacture the light-shielding film below.

The phase shift film was one, in which generation of NOx had been suppressed by inducing generation of $NH_4$ in a high concentration, while manufactured by a sputtering method. In detail, the phase shift film was formed to be a phase shift film including molybdenum (Mo) and silicon (Si) through reactive sputtering, to which a target having Mo and Si in respective composition ratios of 10.75 at % and 89.25 at % has been applied, the electric force of 2 kW was applied, a gas was injected and a light transmitting substrate was rotated at the same time for forming layers through sputtering. During the process of forming layers, while a nitrogen ($N_2$) gas of 70 volume % and an argon gas in a residual amount were injected to be maintained, the concentration of ammonium at the surface was disposed to have a concentration of 50 $ng/cm^2$ to 110 $ng/cm^2$. A phase shift film formed in this manner was thermally treated for 40 minutes at the temperature of 400° C., and subsequently treated by cooling for 40 minutes at 25° C.

A light-shielding film was also manufactured by a sputtering method.

The substrate, on which a phase shift film had been formed, was placed in a chamber of DC sputtering apparatus, T/S distance of a chrome target was set to be 255 mm, and the angle between the substrate and the target was set to be 25 degrees. The atmosphere gas was applied in a volume ratio of 1:3 to 3.5 for nitrogen ($N_2$) to carbon dioxide ($CO_2$). The electric power applied when the layer was formed was a power of about 1.5 kW to about 1.85 kW.

While the substrate was rotated, sputtering was simultaneously performed, and a light-shielding film containing chrome was formed. Thereafter, thermal treatment was applied as above for 15 minutes at a temperature of 200° C. to 300° C., and the light-shielding film after thermal treatment was treated by cooling by applying dry air for 5 minutes in an atmosphere of 20° C. to 30° C. The light-shielding film in the thickness of about 460 to about 580 Å was formed on the phase shift film, and the laminate was prepared.

The light-shielding film formed in this manner was confirmed as having elements in the amounts as follows: chrome in an amount of 35.5 to 41.9 atom %, nitrogen in an amount of 8.4 to 10.5 atom %, oxygen in an amount of 33.0 to 36.3 atom %, and carbon in an amount of 14.0 to 15.4 atom %. Besides, Si in a trace amount (0 to 6.5 atom %) was confirmed.

Cleaning of Light-Shielding Film: Example (1) UV Cleaning Operation
Through a method of UV treatment, the light-shielding film was irradiated by UV (UV ray with the wavelength of 172 nm), which is one kind of electromagnetic radiation under the condition of RT (23° C.) and humidity of 45%±5% for operation of uniform radiation exposure. The irradiation was performed by high power of 40 $mW/cm^2$ and a gas such as $N_2$ and $O_2$ was used as process gas, and recombination a source of pollution on the surface of a mask and inverse pollution caused from bounce back was prevented through strong exhaust (0.01 to 1 kPa) during the process for proceeding thereof. Through such UV treatment, a compound strongly absorbing a wavelength in the range of about 100 nm to about 190 nm was previously removed before proceeding of a subsequent process.

(2) Cleaning Operation with Carbonated Water

Cleaning was performed by using UV (wavelength of 254 nm) and carbonated water ($DICO_2$) as a cleaning solution at the same time (The first cleaning).

At this time, cleaning utilizing the carbonated water or the like as a cleaning solution was performed while applying megasonic. Specifically, the megasonic was applied together when a cleaning solution was injected by a nozzle. When the front of the laminate (the surface of the light-shielding film) was cleaned, the megasonic of 1 MHz and 10 W was applied, and when the rear of the laminate (the surface of quartz) was cleaned, the megasonic was applied with a cleaning solution. At this time, the carbonated water having a conductivity of 3 to 6 µS/cm was applied.

Subsequently, a cleaning solution including hydrogen water and carbonated water was used to perform cleaning of the surface (The second cleaning). The hydrogen water having a hydrogen concentration of 1.0 to 2.0 ppm was applied. The density of the carbonated water, the megasonic applied to the front and the rear, and the like were applied to be same as above. The hydrogen water and the carbonated water were applied to have a volume ratio of 4:3.

Thereafter, cleaning of the surface was performed by hydrogen water ($DIH_2$) (The third cleaning). The concentration of hydrogen ions of the hydrogen water and megasonic were applied to be the same as above.

(3) Rinsing Operation

After completion of cleaning, rinsing treatment was performed by carbonated water ($DICO_2$), and dry by Ramp-up method was performed.

Cleaning of Light-Shielding Film: Comparative Example

Except for excluding carbonated water ($DICO_2$) from the cleaning process, all the other processes were performed as the same as the above cleaning method.

Characteristics of the light-shielding film before and after cleaning were measured and shown in Table 3 below.

Experiment Example: Measurement Example 1

(Sampling and Pretreatment)

Conditions of Storage/Pretreatment: Samples were stored in shipping boxes, unloaded through shipping box ports (SBP) and loaded to pods. All the samples were placed in independent pods and processes thereof were performed separately, and the laminates after being cleaned were separately put into shipping boxes that had been cleaned separately for ion chromatography (IC) inspection. All the conditions (control variable) including variations of the process condition for evaluation were controlled to be the same.

(Ion Chromatography Evaluation)

Dionex ICS-2100 model of Ion Chromatography available from Thermo Scientific was used to perform an evaluation as a method below. The same method was applied to the samples of Table 1, respectively.

Ion Extraction) Each sample of the laminate prepared in a clean bag was put into the shipping box when immediately after the shipping box was opened, and deionized water of 100 ml was injected thereto. A clean bag, in which a sample had been put, was relocated into a water tank prepared at 90° C. to allow ions on the surface of the laminate to fall out sufficiently for 120 minutes.

Eluent Transfer) An eluent for helping separation of ions was obtained and an isocratic process was performed for the eluent to have a concentration and a composition constant during subsequent processes.

Measurement: The eluent and the sample were injected to a measuring apparatus and ion separation and detection were performed.

An ion exchange column was applied by Dinex ICS-2100 Ion Chromatography available from Thermo Scientific, and signals obtained from the electric conductivity of separated ions and RT (retention time) were used to quantify concentration of ions. The results were shown in Table 1 and Table 2 below, respectively.

Experiment Example: Measuring Example 2

(Sampling and Pretreatment)

Storage/Pretreatment Condition: All laminates were put into independent pods for processes proceeding separately, and the laminates after being cleaned were separately put into pods, to which separate cleaning had been completed for measurement by an ellipsometer. All the conditions (control variable) including variations of the process condition for evaluation were controlled to be the same.

(Ellipsometer Evaluation)

MG-PRO model available from NanoView Co., Ltd was used to perform measurement for 7×7 points (Total 49 points) of each sample.

Measurement Result (The Amount of Residual Ion)

The result of ion chromatography (IC) inspection was shown by division into Table 1 and Table 2 below. The results respectively measured for a sample after being cleaned with carbonated water as an Example and a sample, to which carbonated water was not utilized as a Comparative Example, were shown.

Calculation of ion amount was made according to a method below.

ng/Laminate=(Result of IC Analysis−Blank)*DIW amount ng/cm$^2$=(ng/laminate)/504 (laminate area, cm$^2$)

ppb=100 ml as a reference

TABLE 1

| Index | $DICO_2$ Cleaning | Ions Detected by Ion Chromatography (ng/cm$^2$) | | | | |
|---|---|---|---|---|---|---|
| | | $SO_4$ | $NO_2$ | $NO_3$ | F | Cl |
| Example | Done | 0.06 | 0.03 | 0.01 | 0 | 0.02 |
| Comparative Example | Undone | 0.15 | 0.11 | 0.1 | 0 | 0.06 |

| Index | $DICO_2$ Cleaning | Ions Detected by Ion Chromatography (ng/cm$^2$) | | | |
|---|---|---|---|---|---|
| | | $NH_4$ | Sum of NOx | Sum of Halogen Ions | Ionic Impurities | — |
| Example | Done | 0.47 | 0.04 | 0.02 | 0.59 | — |
| Comparative Example | Undone | 1.49 | 0.21 | 0.06 | 1.91 | |

TABLE 2

| Index | DICO$_2$ Cleaning | Ions Detected by Ion Chromatography (ng/cm$^2$) | | | | | |
|---|---|---|---|---|---|---|---|
| | | Na | K | Mg | Ca | Acetate | Formate |
| Example | Done | 0 | 0 | 0 | 0 | 0 | 0 |
| Comparative Example | Undone | 0 | 0 | 0 | 0 | 0 | 0 |

Experiment Example: Additional Comparative Example and Measurement Example 3

Additional Comparative Example

While the light-shielding film was formed and cleaned in the same method as the above Example, ozone water was applied instead of carbonated water. An ozone concentration of 80 to 105 ppm was applied to the ozone water.

Additional Comparative Example was evaluated for variation of a light characteristic and the like before and after cleaning in the same method as the above Example.

(Variation in Light Characteristic Before and After Cleaning)

The variations in the thickness and the light characteristic of a laminate before and after being cleaned were confirmed through repetitive experiments of total 23 times for Examples, and the result was shown in Table 4. Also, the variations in the thickness and the light characteristic of a laminate before and after being cleaned were confirmed through experiments of 15 times for additional Comparative Examples, and the result was shown in Table 4 below.

TABLE 3

| Number | Thickness Variation (Unit: Å) | T (Unit: %) | OD (Unit: %) | R (Unit: %) |
|---|---|---|---|---|
| 1 | −1.06 | 0.002 | −0.01 | −0.27 |
| 2 | −1.03 | 0.002 | −0.01 | −0.18 |
| 3 | −1.12 | 0 | 0 | −0.3 |
| 4 | −1.06 | 0.003 | −0.01 | −0.36 |
| 5 | −1.06 | 0.002 | −0.01 | −0.26 |
| 6 | −1.03 | 0.002 | −0.01 | −0.17 |
| 7 | −1.12 | 0 | 0 | −0.29 |
| 8 | −1.06 | 0.002 | −0.01 | −0.34 |
| 9 | −1.03 | 0.001 | 0 | −0.13 |
| 10 | −1.06 | 0 | 0 | −0.13 |
| 11 | −1.05 | 0 | 0 | −0.15 |
| 12 | −1.2 | 0.001 | −0.01 | −0.1 |
| 13 | −1.2 | 0.001 | −0.01 | −0.1 |
| 14 | −1.2 | 0.001 | −0.01 | −0.1 |
| 15 | −1.2 | 0.001 | −0.01 | −0.1 |
| 16 | −1.2 | 0.001 | −0.01 | −0.1 |
| 17 | −1.06 | 0.002 | −0.01 | −0.26 |
| 18 | −1.03 | 0.002 | −0.01 | −0.17 |
| 19 | −1.12 | 0 | 0 | −0.29 |
| 20 | −1.06 | 0.002 | −0.01 | −0.34 |
| 21 | −0.85 | 0.002 | −0.01 | −0.29 |
| 22 | −1.11 | 0.001 | 0 | −0.11 |
| 23 | −0.95 | 0.002 | −0.01 | −0.27 |
| Average | −1.081 | 0.001 | −0.007 | −0.209 |

TABLE 4

| Number | Thickness Variation (Unit: Å) | T (Unit: %) | OD (Unit: %) | R (Unit: %) |
|---|---|---|---|---|
| 1 | −2.13 | 0.01 | −0.05 | −0.13 |
| 2 | −2.04 | 0.00 | 0.00 | −0.20 |

TABLE 4-continued

| Number | Thickness Variation (Unit: Å) | T (Unit: %) | OD (Unit: %) | R (Unit: %) |
|---|---|---|---|---|
| 3 | −2.22 | 0.00 | 0.00 | −0.20 |
| 4 | −2.06 | 0.00 | −0.02 | −0.23 |
| 5 | −2.24 | 0.01 | −0.05 | −0.21 |
| 6 | −2.11 | 0.01 | −0.05 | −0.21 |
| 7 | −2.13 | 0.02 | −0.10 | −0.22 |
| 8 | −2.27 | 0.01 | −0.06 | −0.23 |
| 9 | −2.31 | 0.02 | −0.11 | −0.20 |
| 10 | −2.19 | 0.01 | −0.06 | −0.20 |
| 11 | −2.39 | 0.01 | −0.06 | −0.18 |
| 12 | −2.12 | 0.01 | −0.06 | −0.19 |
| 13 | −2.02 | 0.01 | −0.06 | −0.20 |
| 14 | −2.41 | 0.01 | −0.05 | −0.21 |
| 15 | −2.18 | 0.02 | −0.10 | −0.19 |
| Average | −2.188 | 0.01 | −0.055 | −0.20 |

Referring to Table 1 and Table 2, it was possible to confirm that the generation of ions, which can cause haze when utilized as a photomask in the laminate, was suppressed when carbonated water had been used in a cleaning process. Also, referring to Table 3 and Table 4, it was possible to confirm that the cleaning applied with carbonated water had an excellent effect in the activation of removing impurities and ions while having an insignificant variation in the film. When compared to an additional Comparative Example applied with ozone, the effect of cleaning applied with carbonated water was more distinctive, and even when laminates including light-shielding films manufactured in the same method, it was possible to confirm that a variation of about two times for thickness variation, a variation of about ten times for transmittance variation, and a variation of about seven times for optical density may be caused depending on cleaning processes.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A laminate where a light-shielding film is disposed,
wherein the light-shielding film comprises a transition metal and an element selected from the group consisting of oxygen, nitrogen, and carbon, and
wherein a reflectance of the light-shielding film is 35% or less with respect to a light having a wavelength of 193 nm,
wherein the laminate comprises residual ions measured by ion chromatography, and wherein the residual ions comprise sulfur-based ions and nitric acid-based ions, and wherein the residual ions comprise sodium ions, phosphoric acid ions, potassium ions, magnesium ions and calcium ions, and a sum of an amount of the sodium ions, an amount of the phosphoric acid ions, an amount of the potassium ions, an amount of the magnesium ions, and an amount of the calcium ions is equal to or more than 0 ng/cm$^2$ and less than or equal to 0.01 ng/cm$^2$.

2. The laminate of claim 1, wherein an amount of the sulfur-based ions is more than 0 ng/cm$^2$ and less than or equal to 0.1 ng/cm$^2$ and an amount of the nitric acid-based ions is more than 0 ng/cm$^2$ and less than or equal to 0.1 ng/cm$^2$.

3. The laminate of claim 1, wherein the residual ions comprise halogen ions, and wherein an amount of the halogen ions is more than 0 ng/cm$^2$ and less than or equal to 0.1 ng/cm$^2$.

4. The laminate of claim 3, wherein the transition metal comprises chrome and the halogen ions comprise fluorine ions or chlorine ions.

5. The laminate of claim 1, wherein the residual ions comprise ammonia ions and an amount of the ammonia ions is more than 0 ng/cm$^2$ and less than or equal to 1.0 ng/cm$^2$.

6. The laminate of claim 1, wherein the residual ions comprise ionic impurities including sulfur-based ions, nitric acid-based ions, halogen ions, and ammonia ions, and an amount of the ionic impurities is more than 0 ng/cm$^2$ and less than or equal to 1.5 ng/cm$^2$.

7. The laminate of claim 1, wherein the laminate is a photomask blank or a photomask.

* * * * *